United States Patent [19]

Keysor

[11] Patent Number: 4,651,112
[45] Date of Patent: Mar. 17, 1987

[54] AUDIO AMPLIFIER SYSTEM

[75] Inventor: Charles W. Keysor, Elgin, Ill.

[73] Assignee: Dukane Corporation, St. Charles, Ill.

[21] Appl. No.: 825,661

[22] Filed: Feb. 3, 1986

[51] Int. Cl.$^4$ ............................................. H03F 3/20
[52] U.S. Cl. .................................. 330/297; 330/202; 330/267; 307/66
[58] Field of Search ............... 330/123, 202, 203, 267, 330/297; 307/64, 66, 87

[56] References Cited

U.S. PATENT DOCUMENTS

| | | | |
|---|---|---|---|
| 3,196,336 | 7/1965 | Schmidt | 321/18 |
| 3,229,111 | 1/1966 | Schumacher et al. | 307/64 |
| 3,240,947 | 3/1966 | Mas | 290/50 |
| 3,293,530 | 12/1966 | Baude | 321/8 |
| 3,339,080 | 8/1967 | Howald | 307/66 |
| 3,356,891 | 12/1967 | Godard | 315/86 |
| 3,373,313 | 3/1968 | Prines et al. | 315/86 |
| 3,418,487 | 12/1968 | Livingston | 307/66 |
| 3,509,357 | 4/1970 | Studtmann | 307/64 |
| 3,515,896 | 6/1970 | Swing et al. | 307/64 |
| 3,614,461 | 10/1971 | Speer et al. | 307/64 |
| 3,703,644 | 11/1972 | Thorborg | 307/64 |
| 3,771,012 | 11/1973 | Niederjohn | 315/86 |
| 3,778,634 | 12/1973 | Hanrihan | 307/66 |
| 4,010,381 | 3/1977 | Fickenscher et al. | 307/66 |
| 4,238,691 | 12/1980 | Ebert, Jr. | 307/66 |
| 4,258,332 | 3/1981 | West | 330/297 |
| 4,484,150 | 11/1984 | Carver | 330/297 |
| 4,510,401 | 4/1985 | Legoult | 307/66 |

OTHER PUBLICATIONS

Brooks, "A 40W Automotive Audio-Power Booster", *Electronic Product Design*, vol. 1, No. 3, Jun. 1980, pp. 25,26.

Primary Examiner—James B. Mullins
Attorney, Agent, or Firm—George H. Gerstman

[57] ABSTRACT

An audio amplifier system is provided including a transformer having a first primary winding that is center-tapped, a second primary winding and a secondary winding. The amplifier system includes a battery backup system by connecting a battery to the center tap of the first primary winding. The second primary winding is connected to a source of alternating current. The output from the secondary winding is rectified and filtered to provide a positive voltage output and a negative voltage output. A complementary symmetry amplifier is provided having a positive voltage power input, a negative voltage power input, an audio signal input and an output. The positive voltage output and negative voltage output are connected, respectively, to the positive voltage power input and the negative voltage power input of the complementary symmetry amplifier. The opposite ends of the first primary winding are alternately grounded to provide excitation of the transformer, with the magnetic flux of the transformer being reversed with each alternation. During AC operation, the first primary winding circuit is open and, during battery operation, the second primary winding circuit is open.

6 Claims, 3 Drawing Figures

AUDIO AMPLIFIER SYSTEM

FIELD OF THE INVENTION

The present invention concerns a novel audio amplifier system. In the illustrative embodiment, a battery-operated audio amplifier system is disclosed. The audio amplifier system may be constructed for AC operation with a battery backup in accordance with the principles of the present invention.

BACKGROUND OF THE INVENTION

Building standards for offices, factories, hotels and hospitals usually require the ability to make announcements to all people within the confines of the premises. These announcements are made possible by means of a suitable microphone-amplifier-speaker arrangement. The amplifier is typically operated from the 60 hertz utility mains. If, however, the 60 hertz utility power should fail, the ability to make announcements would be lost. In certain emergency situations, this inability to make announcements could make it impossible to inform and direct those people within the confines of the building in question, resulting in needless injury and loss of life. Recognizing this danger, building standards have increasingly required that the amplifier means be capable of operation from battery power in the event of mains power failure.

At present, two conventional methods are employed to provide an amplifier with the ability to operate in the event of a 60 hertz mains power failure. Both methods use batteries as the back-up power source. One method results in reduced amplifier performance and requires the use of certain undesirable (due to size and cost) components. The other approach requires that in the event of a mains power failure, the amplifier 60 hertz power input be connected to an expensive, separate unit which will convert battery voltage to 60 hertz, 120 vac.

The first method utilizes what is called the "push-pull" circuit configuration. This approach requires that (via some transformer, rectifier, filter means) the 60 hertz mains power be converted to a single positive low voltage (typically 24 vdc) at high current. The transformer, rectifier and filter means which are capable of providing this low voltage at high current are inherently expensive, due to the restrictions imposed by the physics of handling high currents in such electrical devices. As this circuit operates internally at both a single polarity and a low voltage, some transformer means is required to convert the electrical output of the amplifier to a signal which is high voltage and both positive and negative in polarity. This process requires that the output transformer means be an integral component in the amplification process, for without the transformer, there could be no usable electrical output from the amplifier. Due to the critical interaction of the output transformer with the amplifier circuitry, and the physics of the output transformer, sizable quantities of expensive materials are required to obtain any degree of desirable overall amplifier performance, which results in economic inefficiency. For reasonable amplifier operation characteristics, a feedback winding is required. The extra quantities of higher quality material and the additional feedback winding (which is itself difficult to design) contribute adversely to the expense of the push-pull output transformer.

To operate the above "push-pull" amplifier from a source of battery power, all that is required is a simple means of switching the amplifier's low voltage single polarity power supply to the battery. This transfer takes place only in the event of a 60 hertz mains power failure. While the "push-pull" configuration is easy to operate from a backup battery power source, the economic efficiency of this format suffers from: (1) large and expensive power transformers and associated devices (rectifiers and filters), (2) large and expensive output transformers, and (3) poor performance (frequency response and distortion) due to output transformer limitations and interactions. These limitations exist when operating from either battery or mains power.

A second presently employed method of operating an audio power amplifier from a source of battery power in the event of a 60 hertz mains power failure is not limited to any particular amplifier type. This technique relies upon the use of an inverter. The inverter converts DC battery voltage into 120 vac 60 hertz, as could be obtained from the power mains. The inverter is external to the power audio amplifier configuration. The output of this independent battery powered unit will (in the event of a 60 hertz mains power failure) be connected, via a suitable means of switching, to the mains power input of the audio amplifier. This approach allows the use of any type of audio amplifier, making it possible to obtain very high performance (wide frequency response, low distortion) while operating from a source of battery backup power. The problem with this approach is that the cost of the separate inverter unit is typically greater than the cost of the audio amplifier. A benefit, however, is that if a particular amplifier is not going to be operated from a source of battery power, no concessions in amplifier performance (frequency response, distortion) or cost are required. This is in direct contrast to the previously described "push-pull" amplifier approach, which had low performance and large, expensive transformers, whether or not operation from batteries was required.

It is the object of this invention to circumvent the liabilities of the two previously described methods of obtaining both battery and mains operation from a single amplifier. Specifically, it will be shown that optimum amplifier topologies can be used in battery backed amplifiers despite the limitations imposed by battery operation. Furthermore, this technique allows for the removal of the battery backup circuitry, so that in the instances in which battery operation will not be required, optimum amplifier performance is still provided, without financial burden being placed upon the amplifier.

Another object of the present invention is to provide an audio amplifier system which operates at relatively low current to provide a relatively small transformer and relatively light gauge windings.

A further object of the present invention is to provide an audio amplifier system that is relatively efficient to manufacture.

Another object of the present invention is to provide an audio amplifier system that is simple in construction and efficient in operation.

A still further object of the present invention is to provide an audio amplifier system that may be powered by alternating current but may also utilize battery power if necessary, without placing an additional burden upon the cost of the amplifier.

Other objects and advantages of the present invention will become apparent as the description proceeds.

SUMMARY OF THE INVENTION

In accordance with the present invention, an audio amplifier system is provided which includes a transformer having a first primary winding that is center-tapped and a secondary winding. A source of direct current is connected to the center tap of the first primary winding. The output from the secondary winding is rectified and filtered to provide a positive voltage output and a negative voltage output. The positive voltage output is provided to the positive voltage power input of a complementary symmetry amplifier and the negative voltage output is provided to the negative voltage power input of a complementary symmetry amplifier. The output of the complementary symmetry amplifier is connected to an audio load. Means are provided for alternately grounding the opposite ends of the first primary winding to provide excitation of the transformer with the magnetic flux of the transformer being reversed with each alternation.

In the illustrative embodiment, the secondary winding is center-tapped and the center tap is connected to the audio load. In the illustrative embodiment, the alternately grounding means comprises a first switch coupled to ground and connected in series with a first primary winding on one side of the center tap, and a second switch coupled to ground and connected in series with another portion of the primary winding on the opposite side of the center tap. The first switch and the second switch are alternately opened and closed, whereby the opposite ends of the first primary winding are alternately grounded.

In the illustrative embodiment, the transformer has a second primary winding. The second primary winding is connected to a source of alternating current. During battery operation, the secondary primary winding circuit is open while first primary winding circuit is closed. During alternating current operation, the first primary winding circuit is open while the second primary winding circuit is closed.

In the illustrative embodiment, an audio input is provided having a hot lead and a common lead. The hot lead is connected to the audio input of the complementary symmetry amplifier while the common lead is connected to the audio load.

A more detailed explanation of the invention is provided in the following description and claims, and is illustrated in the accompanying drawings.

DETAILED DESCRIPTION OF THE ILLUSTRATIVE EMBODIMENT

Figure 1:
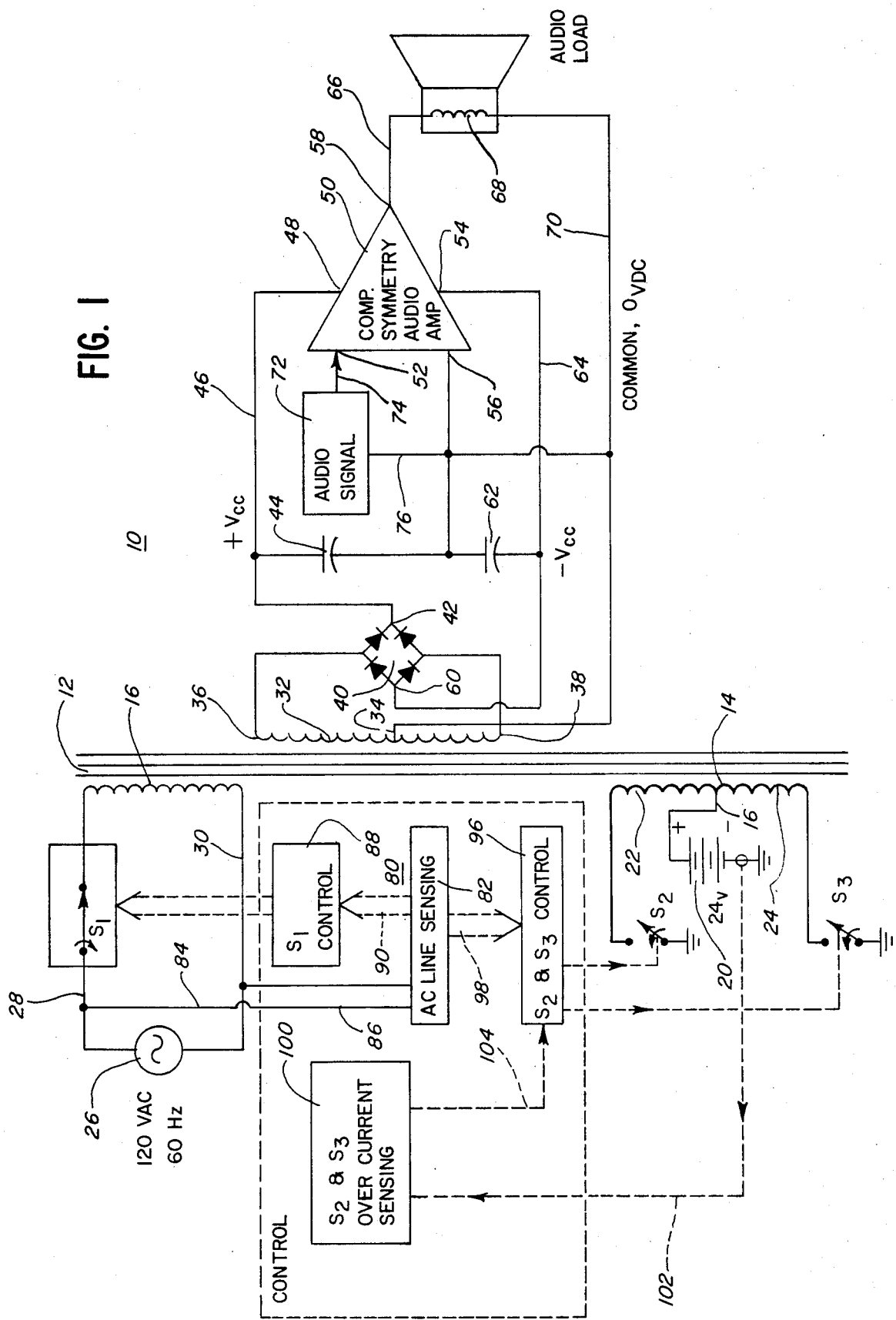
FIG. 1 is a schematic circuit diagram of an audio amplifier system constructed in accordance with the principles of the present invention.

Referring to FIG. 1, an audio amplifier circuit 10 is illustrated therein, including a transformer 12 having a first primary winding 14 and a second primary winding 16. First primary winding 14 is center-tapped at 18 with a battery 20 connected to center tap 18. Upper primary winding half 22 is connected to ground via switch S2 and lower primary winding half 24 is connected to ground via switch S3. The positive terminal of battery 20 is connected to center tap 18 while the negative terminal of battery 20 is connected to ground.

A suitable source of alternating current 26, such as household current of 120 volts and 60 hertz, is connected to second primary winding 16 via line 28 and switch S1 and via line 30 to the opposite side of winding 16. As will be explained in more detail below, when the alternating current circuit (i.e., the second primary winding circuit) is operating, switch S1 will be closed while switches S2 and S3 will be open. On the other hand, when there is battery operation (i.e., the first primary winding circuit is operating), switch S1 will be open.

Transformer 12 includes a secondary winding 32 that is center-tapped at 34, with the opposite ends 36 and 38 of secondary winding 32 being connected to a full wave rectifier 40. The positive output 42 of full wave rectifier 40 is filtered by means of capacitor 44 and the rectified and filtered positive voltage output is fed via line 46 to the positive voltage power input 48 of a complementary symmetry amplifier 50. Complementary symmetry amplifier 50 is a conventional complementary symmetry amplifier as is well-known in the art, and includes an audio signal input 52, positive voltage power input 48, negative voltage power input 54, common line input 56, and output 58.

The negative voltage output 60 of full wave rectifier 40 provides a negative voltage output that is filtered via capacitor 62 and fed via line 64 to the negative voltage power input 54 of complementary symmetry amplifier 50.

The output 58 of amplifier 50 is connected via line 66 to an audio load 68, such as a loudspeaker, with the opposite end of audio load 68 being connected to common line 70. Common line 70 is also connected to center tap 34 of transformer secondary 32 and to input 56 of amplifier 50.

An audio signal is provided from a microphone 72 or any other means for providing an audio signal. Audio signal means 72 includes a hot lead 74 connected to the audio input 52 of amplifier 50 and a common lead 76 connected to common lead 70.

A control circuit 80 is provided for controlling the operation of the primary winding circuit. Control circuit 80 includes an AC line sensing means 82 connected via line 84 to line 28 and via line 86 to line 30 of the second primary winding circuit. AC line sensing circuit 82 will sense when the alternating current 26 is operating and when it is operating it will signal S1 control 88 via line 90 to close switch S1. However, when AC line sensing circuit 82 senses that the alternating current 26 is not operating, it will signal S2 and S3 control 96 via line 98 to operate switches S2 and S3 for battery operation, and will signal S1 control 88 to open switch S1. Thus once switch S1 is opened, switches S2 and S3 will be operated alternately to provide the battery operation. When switches S2 and S3 are operated alternately, the opposite ends of the first primary winding 14 are alternately grounded. In this manner, the transformer is excited with the magnetic flux of the transformer being reversed with each alternation. This enables two DC voltages of equal magnitude but opposite polarity to be applied via lines 46 and 64 to inputs, respectively, 48 and 54 of complementary symmetry amplifier 50.

The complementary symmetry amplifier configuration shown herein provides input buffering, then voltage gain and then current gain. Incorporated within the circuit are varying degrees of both local and overall feedback, which are beneficial to circuit behavior. As stated above, output 58 of amplifier 50 is then applied directly to a useful audio load without requiring the use of a costly or a large output transformer. If an output transformer is required to provide increased voltage levels, feedback windings will not be required in the transformer. This simplifies the output transformer design and eliminates the complex interaction of the transformer with the amplifier, as is the case in a push-pull amplifier configuration.

In accordance with the present invention, using both the center tap first primary winding and the second primary winding, the voltage levels after the common rectifier-filter means are the same whether the 120 volts, 60 hertz AC operation is utilized or whether the 24 volt battery operation is utilized. It is thus seen that the complementary symmetry amplifier can perform substantially identically when operated from either 120 volt power mains or from a single polarity low voltage direct current.

Figure 2:
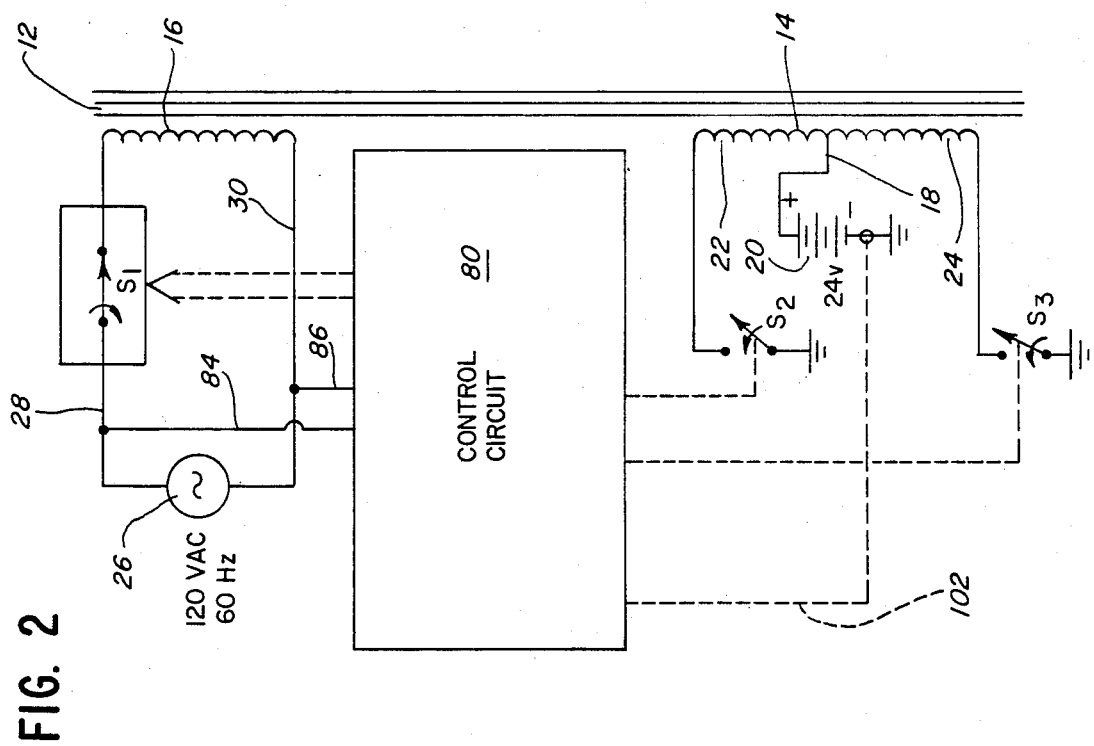
FIG. 2 is a schematic circuit diagram of the primary winding circuits during battery operation of the circuit of FIG. 1.

FIG. 2 illustrates the operation of the system when the alternating current has failed. In this operation, switch S1 is open while switches S2 and S3 are alternately opened and closed.

Figure 3:
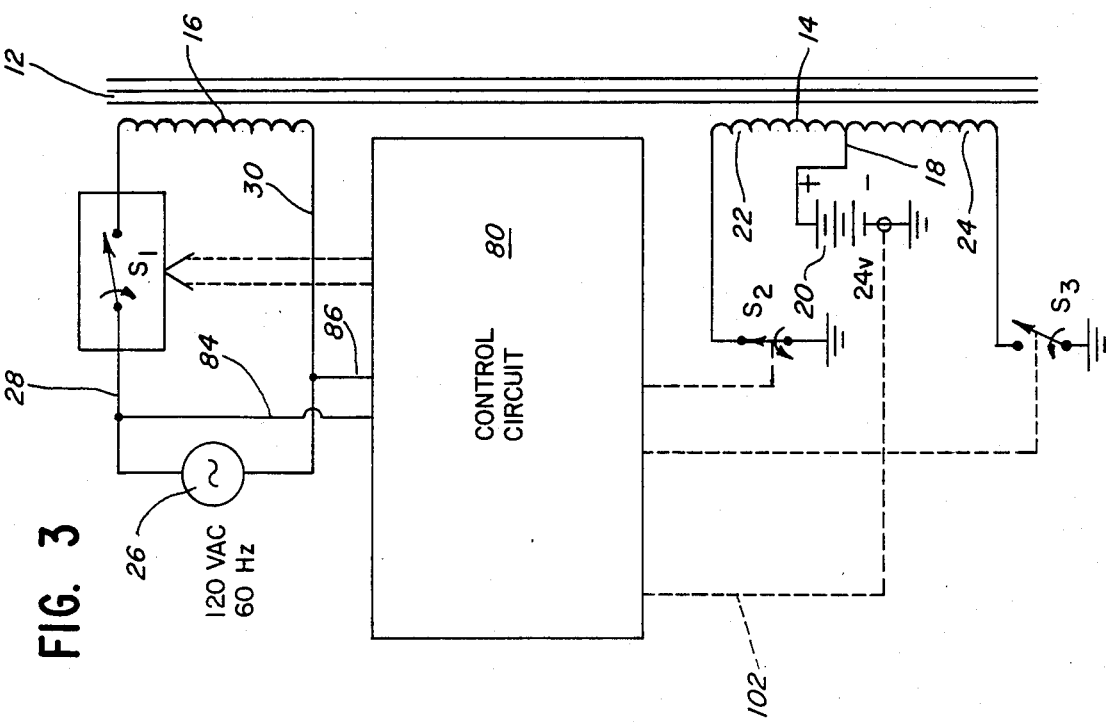
FIG. 3 is a schematic circuit diagram of the primary winding circuits during alternating current operation of the circuit of FIG. 1.

FIG. 3 illustrates the operation of the circuit during the alternating current operation. In this operation, switch S1 is closed while switches S2 and S3 remain open.

As illustrated in FIG. 1, an over-current protection circuit is provided including S2 and S3 over-current sensing means 100. The negative terminal of battery 20 is connected via line 102 to the over-current sensing circuit 100 and if an excessive current is sensed by circuit 100, a signal is provided via line 104 to S2 and S3 control circuit 96 to open switches S2 and S3.

Although an illustrative embodiment of the invention has been shown and described, it is to be understood that various modifications and substitutions may be made by those skilled in the art without departing from the novel spirit and scope of the present invention.

What is claimed is:

1. An audio amplifier system, which comprises:
    a transformer having a first primary winding that is center-tapped and a secondary winding;
    said transformer having a second primary winding;
    means for connecting a source of direct current to said center tap of the first primary winding;
    means for alternately grounding the opposite ends of the first primary winding to provide excitation of the transformer with the magnetic flux of the transformer being reversed with each alternation;
    means for connecting said second primary winding to a source of alternating current;
    means for opening the second primary winding circuit during operation of the first primary winding and for opening the first primary winding circuit during operation of the second primary winding;
    means for rectifying and filtering the output from the secondary winding to provide a positive voltage output and a negative voltage output;
    a complementary symmetry amplifier having a positive voltage power input, a negative voltage power input, an audio signal input, and an output;
    means connecting said positive voltage output to said positive voltage power input of the complementary symmetry amplifier;
    means connecting said negative voltage output to the negative voltage power input of the complementary symmetry amplifier; and
    means connecting the complementary symmetry amplifier output to an audio load.

2. An audio amplifier system as described in claim 1, said secondary winding being center-tapped; and means for connecting said secondary winding center tap to said audio load.

3. An audio amplifier system as described in claim 1, said alternately grounding means comprising a first switch coupled to ground and connected in series with the first primary winding on one side of the center tap, and a second switch coupled to ground and connected in series with another portion of the primary winding on the opposite side of the center tap, and means for alternately opening said first switch when said second switch is closed and opening said second switch when said first switch is closed, whereby the opposite ends of the first primary winding are alternately grounded.

4. An audio amplifier system as described in claim 1, including an audio input having a hot lead and a common lead; means for connecting the hot lead to the audio input of the complementary symmetry amplifier; and means for connecting the common lead to the audio load.

5. An audio amplifier system, which comprises:
    a transformer having a first primary winding that is center-tapped, a second primary winding, and a secondary winding that is center-tapped;
    means for connecting a source of direct current to said center tap of said first primary winding;
    means for alternately grounding the opposite ends of the first primary winding to provide excitation of the transformer with the magnetic flux of the transformer being reversed with each alternation;
    means for connecting a source of alternating current to said second primary winding;
    means for rectifying and filtering the output from said secondary winding to provide a positive voltage output and a negative voltage output;
    a complementary symmetry amplifier having a positive voltage power input, a negative voltage power input, an audio signal input, and an output;
    means connecting the positive voltage output to the positive voltage power input of the complementary symmetry amplifier;
    means connecting the negative voltage output to the negative voltage power input of the complementary symmetry amplifier;
    means connecting the complementary symmetry amplifier output to an audio load;
    means for connecting said secondary winding center tap to said audio load;
    an audio input having a hot lead and a common lead;
    means for connecting said hot lead to aid audio input of the complementary symmetry amplifier;
    means for connecting said common lead to said audio load; and
    means for opening the second primary winding circuit during operation of the first primary winding and for opening the first primary winding circuit during operation of the second primary winding.

6. An audio amplifier system as described in claim 5, said alternately grounding means comprising a first switch coupled to ground and connected in series with the first primary winding on one side of the center tap, and a second switch coupled to ground and connected in series with another portion of the primary winding on the opposite side of the center tap, and means for alternately opening said first switch when said second switch is closed and opening said second switch when said first switch is closed, whereby the opposite ends of the first primary winding are alternately grounded.

* * * * *